(12) United States Patent
Yoshiuchi et al.

(10) Patent No.: US 9,231,119 B2
(45) Date of Patent: Jan. 5, 2016

(54) SENSOR

(75) Inventors: Shigehiro Yoshiuchi, Kyoto (JP);
Takashi Imanaka, Osaka (JP); Takami Ishida, Osaka (JP); Satoshi Ohuchi, Hyogo (JP); Hideo Ohkoshi, Fukui (JP); Katsuya Morinaka, Fukui (JP); Daisuke Nakamura, Fukui (JP); Hiroyuki Nakamura, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 110 days.

(21) Appl. No.: 13/983,770

(22) PCT Filed: Mar. 5, 2012

(86) PCT No.: PCT/JP2012/001484
§ 371 (c)(1),
(2), (4) Date: Aug. 5, 2013

(87) PCT Pub. No.: WO2012/124282
PCT Pub. Date: Sep. 20, 2012

(65) Prior Publication Data
US 2013/0307094 A1     Nov. 21, 2013

(30) Foreign Application Priority Data

Mar. 11, 2011   (JP) .................................. 2011-054118
Mar. 22, 2011   (JP) .................................. 2011-061964

(51) Int. Cl.
*H01L 29/84*     (2006.01)
*G01C 19/5783*   (2012.01)
*G01P 1/02*      (2006.01)
*H01L 41/08*     (2006.01)

(52) U.S. Cl.
CPC ............ *H01L 29/84* (2013.01); *G01C 19/5783* (2013.01); *G01P 1/023* (2013.01); *H01L 41/08* (2013.01)

(58) Field of Classification Search
USPC .................................................. 257/696, 702
See application file for complete search history.

(56) References Cited

U.S. PATENT DOCUMENTS 6,255,728 B1 *  7/2001  Nasiri et al. ................... 257/704
6,369,435 B1    4/2002  Igel
6,559,530 B2 *  5/2003  Hinzel et al. .................. 257/684

(Continued)

FOREIGN PATENT DOCUMENTS

JP      09-178492 A        7/1997
JP      2000-150914        5/2000

(Continued)

OTHER PUBLICATIONS

International Search Report issued in International Application No. PCT/JP2012/001484 with Date of mailing Apr. 17, 2012.

*Primary Examiner* — Cuong Q Nguyen
*Assistant Examiner* — Nishath Yasmeen
(74) *Attorney, Agent, or Firm* — McDermott Will & Emery LLP

(57) ABSTRACT

A sensor includes a circuit board, a wiring connection layer, a sensor element, and a conductive post. The circuit board has a first electrode. The wiring connection layer has second and third electrodes. The second electrode is connected to the first electrode. The sensor element has a fourth electrode. The conductive post connects the third electrode electrically with the fourth electrode. This sensor can be driven efficiently.

16 Claims, 19 Drawing Sheets

(56) References Cited

U.S. PATENT DOCUMENTS

| | | | |
|---|---|---|---|
| 8,907,447 B2* | 12/2014 | Wang et al. ............. 257/531 |
| 2003/0167850 A1* | 9/2003 | Ishiguro et al. ............. 73/718 |
| 2004/0055387 A1 | 3/2004 | Miyazaki et al. |
| 2006/0001137 A1* | 1/2006 | Hundt et al. ............. 257/678 |
| 2006/0006511 A1* | 1/2006 | Roh et al. ............. 257/680 |
| 2006/0063462 A1* | 3/2006 | Ding et al. ............. 445/25 |
| 2006/0121690 A1* | 6/2006 | Pogge et al. ............. 438/455 |
| 2006/0131731 A1* | 6/2006 | Sato ............. 257/704 |
| 2008/0028855 A1* | 2/2008 | Kano et al. ............. 73/504.12 |
| 2008/0093740 A1 | 4/2008 | Sakai et al. |
| 2009/0194829 A1* | 8/2009 | Chung et al. ............. 257/415 |
| 2009/0211352 A1 | 8/2009 | Hatanaka et al. |
| 2009/0230487 A1 | 9/2009 | Saitoh et al. |
| 2010/0090297 A1 | 4/2010 | Nakatani |

FOREIGN PATENT DOCUMENTS

| | | |
|---|---|---|
| JP | 2003-329443 A | 11/2003 |
| JP | 2004-053329 A | 2/2004 |
| JP | 2005-169541 A | 6/2005 |
| JP | 2005-233889 A | 9/2005 |
| JP | 2006-261298 A | 9/2006 |
| JP | 2008-101980 | 5/2008 |
| JP | 2009-071263 A | 4/2009 |
| JP | 2009-175113 A | 8/2009 |
| JP | 2010-060464 A | 3/2010 |
| JP | 2010-062448 A | 3/2010 |
| JP | 2010-091467 A | 4/2010 |
| JP | 2010-283021 A | 12/2010 |
| WO | WO-02/079743 A1 | 10/2002 |
| WO | WO 2011103259 A2 * | 8/2011 |

* cited by examiner

SENSOR

This application is the U.S. National Phase under 35 U.S.C. §371 of International Application No. PCT/JP2012/001484, filed on Mar. 5, 2012, which in turn claims the benefit of Japanese Application No. 2011-054118, filed Mar. 11, 2011 and Japanese Patent Application No. 2011-061964, filed Mar. 22, 2011, the disclosures of which Applications are incorporated by reference herein.

TECHNICAL FIELD

The present invention relates to a sensor including a circuit board and a sensor element stacked in eth circuit board.

BACKGROUND ART

Small mobile devices, such as digital cameras, mobile phones and portable game devices, that are equipped with sensors, such as angular velocity sensors and acceleration sensors, have become widespread recently. With this trend, there is a strong demand for small-sized sensors having smaller footprint, lower profile and higher accuracy. Patent literature 1 discloses a sensor including a sensor chip and a circuit chip stacked and accommodated in a ceramic package to reduce a size of the sensor.

FIG. 21 is a schematic sectional view of conventional sensor 50, an angular velocity sensor described in Patent Literature 1. Sensor chip 55 is stacked on circuit chip 53 via film adhesive 54. Circuit chip 53 is fixed to an upper surface of ceramic package 51 with adhesive 52. Sensor chip 55 and circuit chip 53 are electrically connected with bonding wire 56. Circuit chip 53 and ceramic package 51 are connected electrically with bonding wire 57. This stacked structure in which sensor chip 55 and circuit chip 53 are stacked provides sensor 50 with a small size. Sensor 50 detects an angular velocity as an electrical signal converted from a Coriolis force generated when a moving object rotates, due to the angular velocity exerted upon it. An analog detection signal of the Coriolis force detected by sensor chip 55 undergoes a predetermined digital-signal processing in circuit chip 53, and it is output as an angular velocity detection signal. A mobile device equipped with the angular velocity sensor executes various processes by using this angular velocity detection signal.

In conventional sensor 50, electrodes of sensor chip 55 and circuit chip 53 are connected via bonding wire 56 since they cannot be connected directly due to a difference in areas of their surfaces. In general, the analog detection signal output from sensor chip 55 to circuit chip 53 is a very small signal. The analog detection signal input from sensor chip 55 is converted into a digital signal, and a necessary digital signal processing is carried out in circuit chip 53 to produce an angular velocity detection signal. The angular velocity detection signal transmits as a digital signal from circuit chip 53 to ceramic package 51 through bonding wire 57. For this reason, a high-frequency digital noise is radiated from bonding wire 57, which causes an adverse effect on the analog detection signal flowing through bonding wire 56. This effect of the digital noise becomes more remarkable as increase in lengths of bonding wires 56 and 57. The digital signal in circuit chip 53 may intrude directly into sensor chip 55 as a noise, and adversely affects the analog detection signal in sensor chip 55. Furthermore, a noise generated outside of sensor 50 may cause an adverse influence directly upon the analog detection signal. These effects may decrease detecting accuracy of the angular velocity sensor.

FIG. 22A is an exploded perspective view of another conventional sensor 501 disclosed in Patent Literature 2. Sensor 501 is known as an IC-integrated acceleration sensor. FIG. 22B is a cross-sectional view of sensor 501 shown in FIG. 22A. Sensor 501 includes sensor chip 502, IC chip 503 for electrically processing a detection signal from sensor chip 502, protective case 504 accommodating sensor chip 502 and IC chip 503, and cover 504a that hermetically seals an inner space of protective case 504.

Sensor chip 502 includes flexible portion 502a, weight 502b, and support body 502c. A piezo-resistance element is disposed onto flexible portion 502a for converting acceleration exerted on sensor chip 502 into an electric detection signal. A row of sensor chip terminals 505 is formed on an upper surface along one side edge of support body 502c.

IC chip 503 includes a processing circuit and chip terminals 506 formed on its main surface. When the main surface is oriented upward, IC chip 503 is bonded to the upper surface of support body 502c of sensor chip 502 with a predetermined space to the upper surface of support body 502c with adhesive 507a containing fine rigid plastic balls, thereby restraining a movable range of flexible portion 502a and weight 502b of sensor chip 502.

The lower part of support body 502c is also bonded to an upper surface of protective case 504 with a predetermined space with adhesive 507b containing fine rigid plastic balls, so as to restrain a vibration range of weight 502b of sensor chip 502.

Some of chip terminals 506 are electrically connected with sensor chip terminals 505 through wires 508a, and the other of chip terminals 506 are electrically connected with protective case terminals 509 through wires 508b.

In conventional sensor 501, wires 508a connecting chip terminals 506 with sensor chip terminals 505, and wires 508b connecting chip terminals 506 with protective case terminals 509 protrude above the main surface of IC chip 503 having the processing circuit and IC chip terminals 506 provided thereon. This structure prevents sensor 501 from having a small overall height.

In addition, sensor chip 502 is physically joined directly to both a lower surface of IC chip 503 and the upper surface of protective case 504 with adhesives 507a and 507b, respectively. Therefore, stresses resulting from curing of adhesives 507a and 507b remain built up around support body 502c and flexible portion 502a of sensor chip 502. A thermal stress may be developed due to a difference in linear expansion coefficients of protective case 504 and sensor chip 502. Furthermore, another stress is exerted directly on support body 502c of sensor chip 502 if a printed circuit board having protective case 504 mounted thereon deforms. These stresses can degrade a temperature characteristic of the sensor output, cause hysteresis in the sensor output and the like, thereby decreasing accuracy of sensor 501 for detecting accelerations.

CITATION LIST

Patent Literature

Patent Literature 1: Japanese Patent Laid-Open Publication No. 2005-233889
Patent Literature 2: Japanese Patent Laid-Open Publication No. 2005-169541

SUMMARY OF THE INVENTION

A sensor includes a circuit board, a wiring connection layer, a sensor element, and a conductive post. The circuit board has a first electrode. The wiring connection layer has second and third electrodes. The second electrode is connected to the first electrode. The sensor element has a fourth electrode. The conductive post connects the third electrode electrically with the fourth electrode.

This sensor can be driven efficiently.

DETAIL DESCRIPTION OF PREFERRED EMBODIMENTS

Exemplary Embodiment 1

Figure 1:
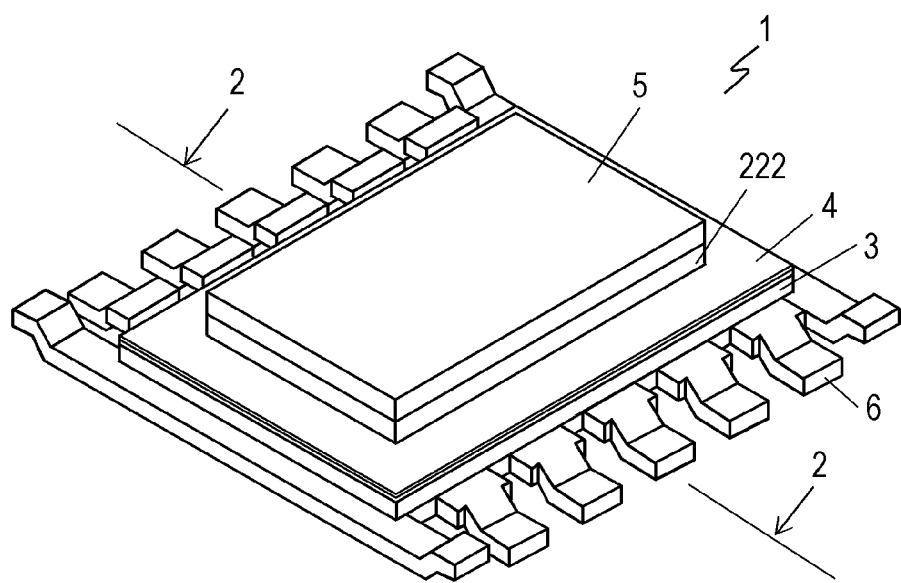
FIG. 1 is a perspective view of a sensor according to Exemplary Embodiment 1 of the present invention.
Figure 2:
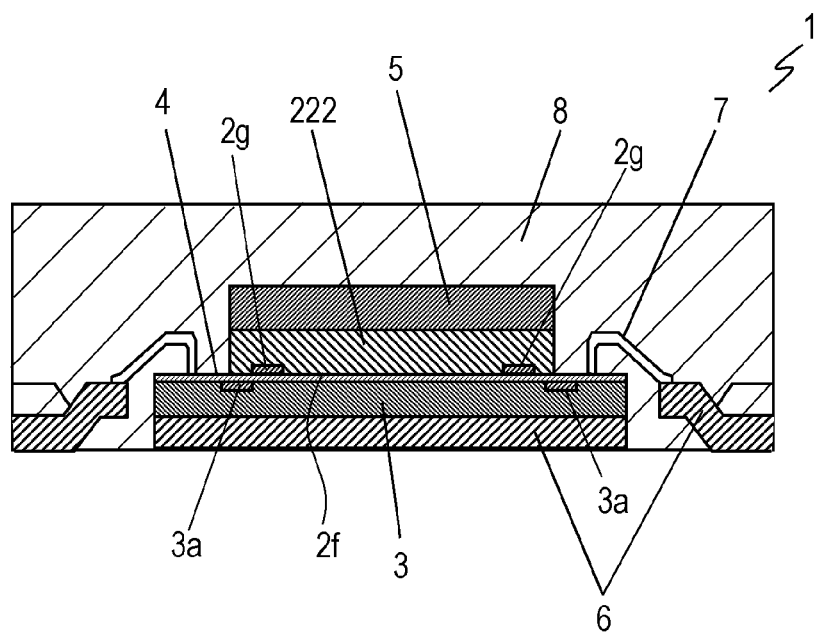
FIG. 2 is a schematic sectional view of the sensor at line 2-2 shown in FIG. 1.
Figure 3A:
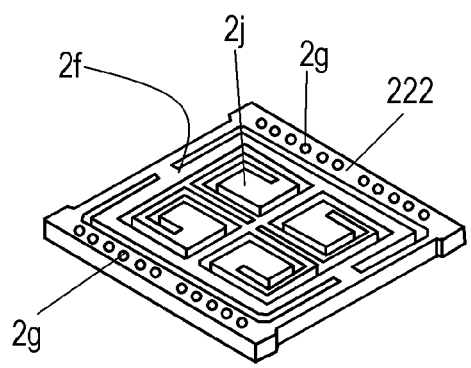
FIG. 3A is a perspective view of a sensor element of the sensor according to Embodiment 1.
Figure 3B:
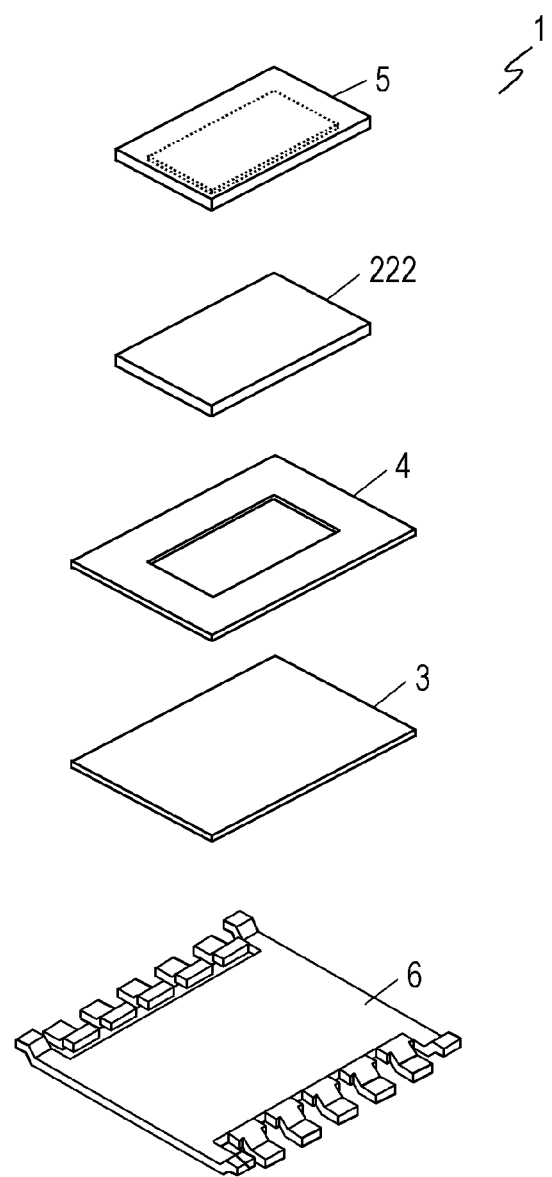
FIG. 3B is an exploded perspective view of the sensor according to Embodiment 1.

FIG. 1 is a perspective exterior view of sensor 1, an angular velocity sensor according to Exemplary Embodiment 1 of the present invention. FIG. 2 is a schematic sectional view of sensor 1 at line 2-2 shown in FIG. 1. FIG. 3A is a perspective view of sensor element 222 of sensor 1. FIG. 3B is an exploded perspective view of sensor 1. As shown in FIG. 1 to FIG. 3B, sensor 1 includes sensor element 222, circuit board 3, wiring connection layer 4 that electrically connects sensor element 222 with circuit board 3, top cover 5 provided on an upper surface of sensor element 222, and lead frame 6 that functions as an interconnection board for carrying circuit board 3. The individual components are bonded and fixed together with, e.g. film adhesive to form a stacked structure. The areas of circuit board 3 and wiring connection layer 4 are substantially equal to each other, whereas the area of sensor element 222 is smaller than the area of circuit board 3. Wiring connection layer 4 and lead frame 6 are connected electrically with bonding wires 7. Top cover 5, sensor element 222, and circuit board 3 constitute a structure that is molded with resin 8, such as an epoxy resin. Sensor 1 molded with resin 8 has a strength and electrical isolation against vibrations and impacts to which sensor 1 is susceptible when installed into, e.g. a mobile device.

Sensor element 222 is a vibrator having a piezoelectric element formed on a silicon substrate so that it vibrates mechanically. The piezoelectric element has a structure including an upper electrode and a lower electrode provided on top and bottom of a thin piezoelectric film. Sensor element 222 may be formed by processing a piezoelectric material, and may preferably have a structure having a piezoelectric element formed on a silicon substrate which can be processed precisely by a Micro Electro Mechanical Systems (MEMS) technique, thereby providing sensor element 222 with a small size. Sensor element 222 has electrode-bearing surface 2f at which electrodes 2g is provided, as shown in FIG. 3A, and it is stacked such that electrode-bearing surface 2f faces wiring connection layer 4.

In this structure, a displacement of the vibrator due to the Coriolis force produced when an angular velocity is applied is detected as an electric charge generated by the piezoelectric element. The detected electric charge is then output to circuit board 3 as an analog detection signal.

Circuit board 3 includes a circuit formed by a semiconductor process on a silicon substrate to generate an angular velocity signal. In other words, circuit board 3 receives the above analog detection signal from sensor element 222 via wiring connection layer 4, performs a synchronous detection process to eth signal, and converts the signal into a digital signal by A/D conversion. Circuit board 3 performs processes, such as filtering process and correction process, to the digital signal, and outputs an angular velocity detection signal as a digital signal Lead frame 6 functions as an interconnection board between wiring connection layer 4 and an external circuit outside sensor 1. Lead frame 6 is made of a material, such as copper and aluminum, having high conductivity, and is connected, with bonding wires 7, to the electrodes arranged along an outer periphery of wiring connection layer 4. Thus, sensor 1 exchanges signals with the outside via lead frame 6.

Wiring connection layer 4 electrically connects sensor element 222 with circuit board 3, and has a wiring layer of fine conductors including a power supply line, a grounding line, a signal line, and electrodes made of conductive metal, such as copper or aluminum, on a surface of an insulation layer made of resin, such as polyimide. Wiring connection layer 4 has a multilayered structure including insulation layers and wiring layers which are alternately stacked thereon by a thin-film technique. Wiring connection layer 4 further includes metallic via-conductors formed in the insulation layers for connecting between the electrodes on the individual wiring layers, between the electrodes on any of the wiring layers and sensor element 222 or circuit board 3. The polyimide resin can reduce an adverse influence of high frequency noise on the signal conductors attributable to capacitive coupling between the wiring layers since the polyimide resin has a low dielectric constant which reduces wiring capacitances, besides high heat resistance and high insulation property. In addition, wiring connection layer 4 can be thin to decrease a height of sensor 1 since there is a small capacitive coupling between upper and lower wiring layers that sandwich the insulation layer. Further details of wiring connection layer 4 will be described later.

As described above, the area of sensor element 222 is smaller than the area of circuit board 3, and sensor element 222 is placed substantially at the center of the upper surface of circuit board 3. This structure hardly allows the electrodes of sensor element 222 to be connected directly with circuit board 3.

Figure 4:
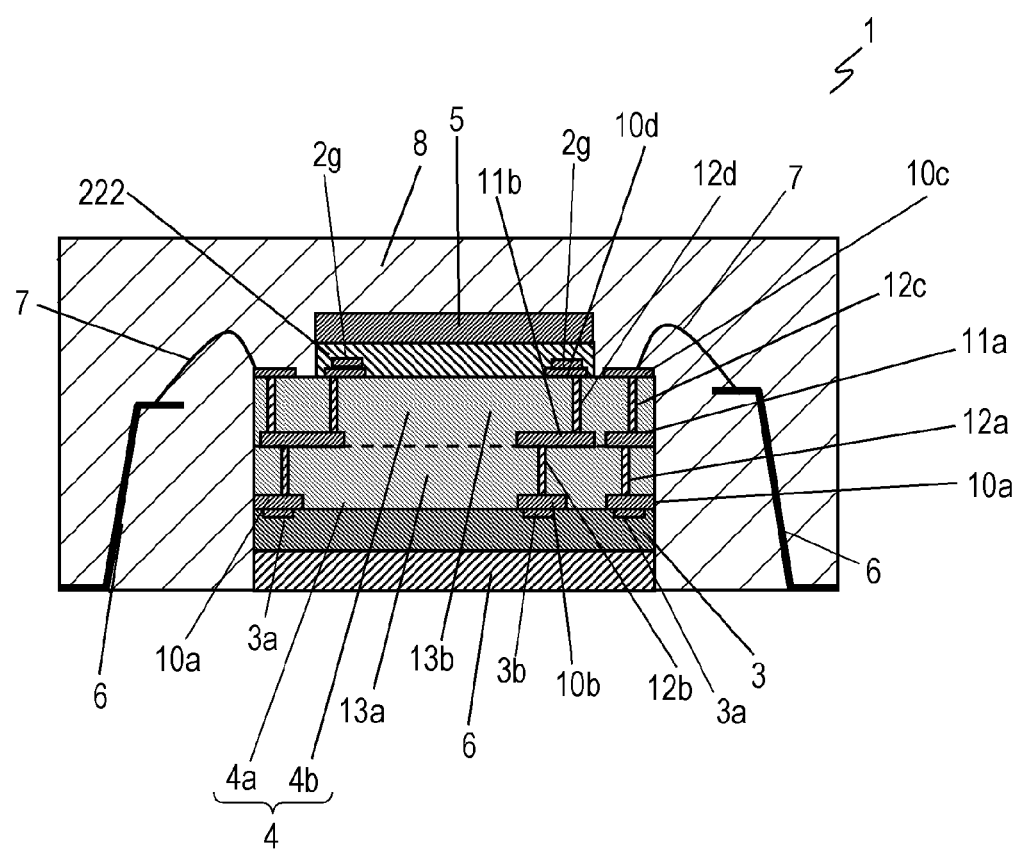
FIG. 4 is a schematic sectional view of the sensor according to Embodiment 1.

FIG. 4 is a schematic sectional view of sensor 1 according to Embodiment 1. The sectional view shown in FIG. 4 is a diagrammatic illustration of sensor 1, and the thickness of wiring connection layer 4 is actually smaller than any of the thickness of sensor element 222 and the thickness of circuit board 3. FIG. 4 shows an example in which wiring connection layer 4 has a two-layer structure. That is, wiring connection layer 4 includes wiring connection layers 4a and 4b stacked on each other. A structure of wiring connection layer 4 and electrical connections between sensor element 222 and circuit board 3 will be detailed below with referring to FIG. 4. Electrodes 3a and 3b are provided at a surface of circuit board 3. Electrodes 10a and 10b are provided at a surface of wiring connection layer 4. Electrodes 3a and 3b are connected to electrodes 10a and 10b, respectively. Wiring connection layer 4a includes insulation layer 13a, wiring layers 11a and 11b made of metallic conductor on an upper surface of insulation layer 13a, and via-conductors 12a and 12b passing through insulation layer 13a. Wiring layer 11a and electrode 10a are connected through via-conductor 12a while wiring layer 11b and electrode 10b are connected through via-conductor 12b.

Wiring connection layer 4b includes insulation layer 13b, electrodes 10c and 10d provided on an upper surface of insulation layer 13b, and via-conductors 12c and 12d passing through insulation layer 13b. Wiring layer 11a of wiring connection layer 4a and electrode 10c of wiring connection layer 4b are connected through via-conductor 12c. Wiring layer 11b and electrode 10d are connected through via-conductor 12d. Electrode 10d is connected directly to electrode 2g of sensor element 222. Electrode 10c of wiring connection layer 4b is connected with lead frame 6 via bonding wire 7.

For example, a weak analog detection signal output from electrode 2g of sensor element 222 in response to an applied angular velocity is input to electrode 3b of circuit board 3 through electrode 10d, via-conductor 12d, wiring layer 11b, via-conductor 12b, and electrode 10b. An angular velocity detection signal as a digital signal output from electrode 3a of circuit board 3 is output to the outside of sensor 1 through electrode 10a, via-conductor 12a, wiring layer 11a, via-conductor 12c, electrode 10c, bonding wire 7, and lead frame 6.

Other than these signals, the power supply, grounding and the like lines are connected through wiring connection layers 4a and 4b.

Wiring layers 11a and 11b and via-conductors 12a to 12d have short wiring lengths to reduce their impedances, and accordingly, reduce an effect of high-frequency digital noise radiated from bonding wires 7. In addition, the polyimide resin has a low dielectric constant to provide small wiring capacitances between the wiring layers and between the via-conductors, and accordingly, can reduce an influence of high-frequency noise of the digital signal exerted on the analog detection signal inside wiring connection layer 4. An increase of the number of layers of wiring connection layer 4 reduces the influence of the noise and increases a degree of wiring flexibility.

Figure 21:
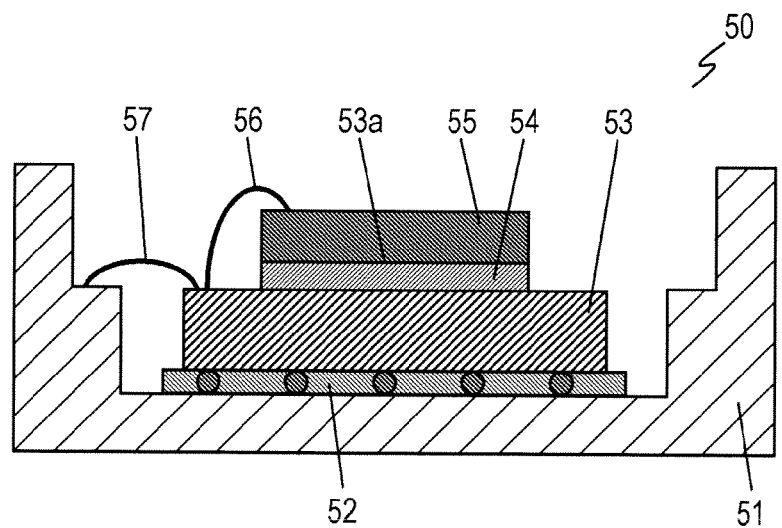
FIG. 21 is a schematic sectional view of a conventional sensor.
Figure 22A:
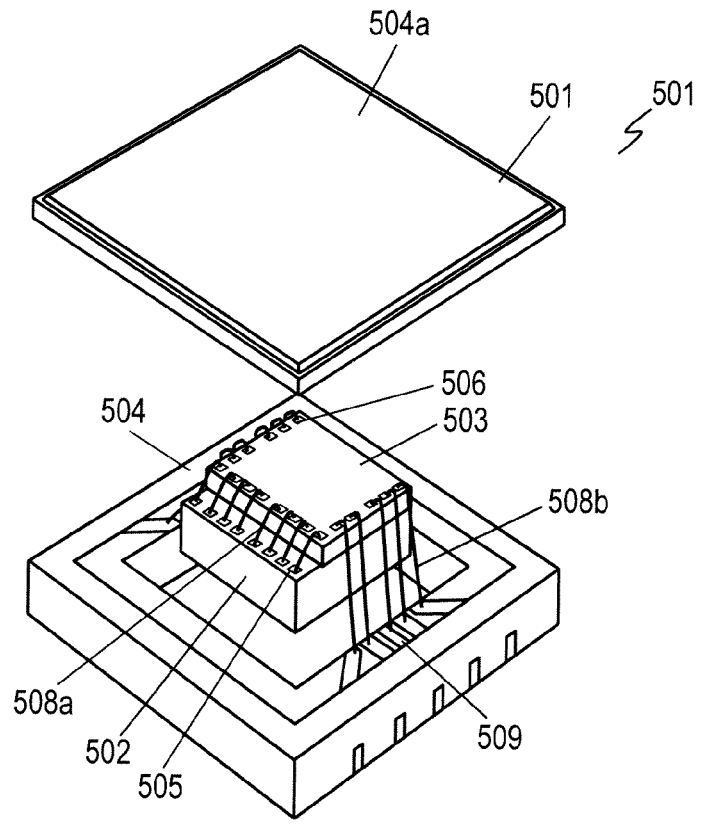
FIG. 22A is an exploded perspective view of another conventional sensor.
Figure 22B:
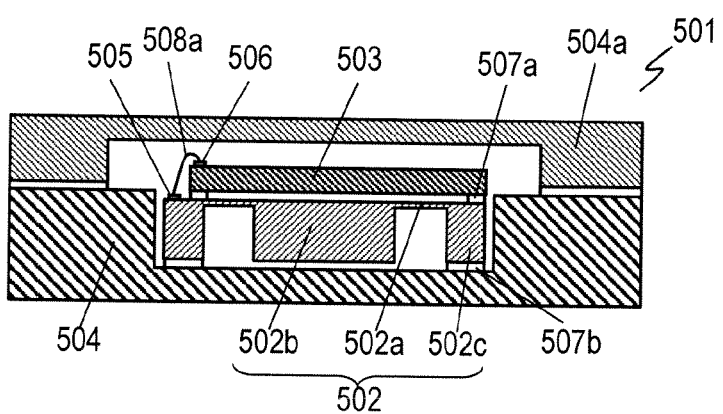
FIG. 22B is a cross-sectional view of the sensor shown in FIG. 22A.

Furthermore, sensor 1 according to Embodiment 1 is molded with resin 8 may not be necessarily accommodated in a ceramic package used in conventional sensor 50 shown in FIG. 21, hence having a smaller size than conventional sensor 50.

Figure 5:
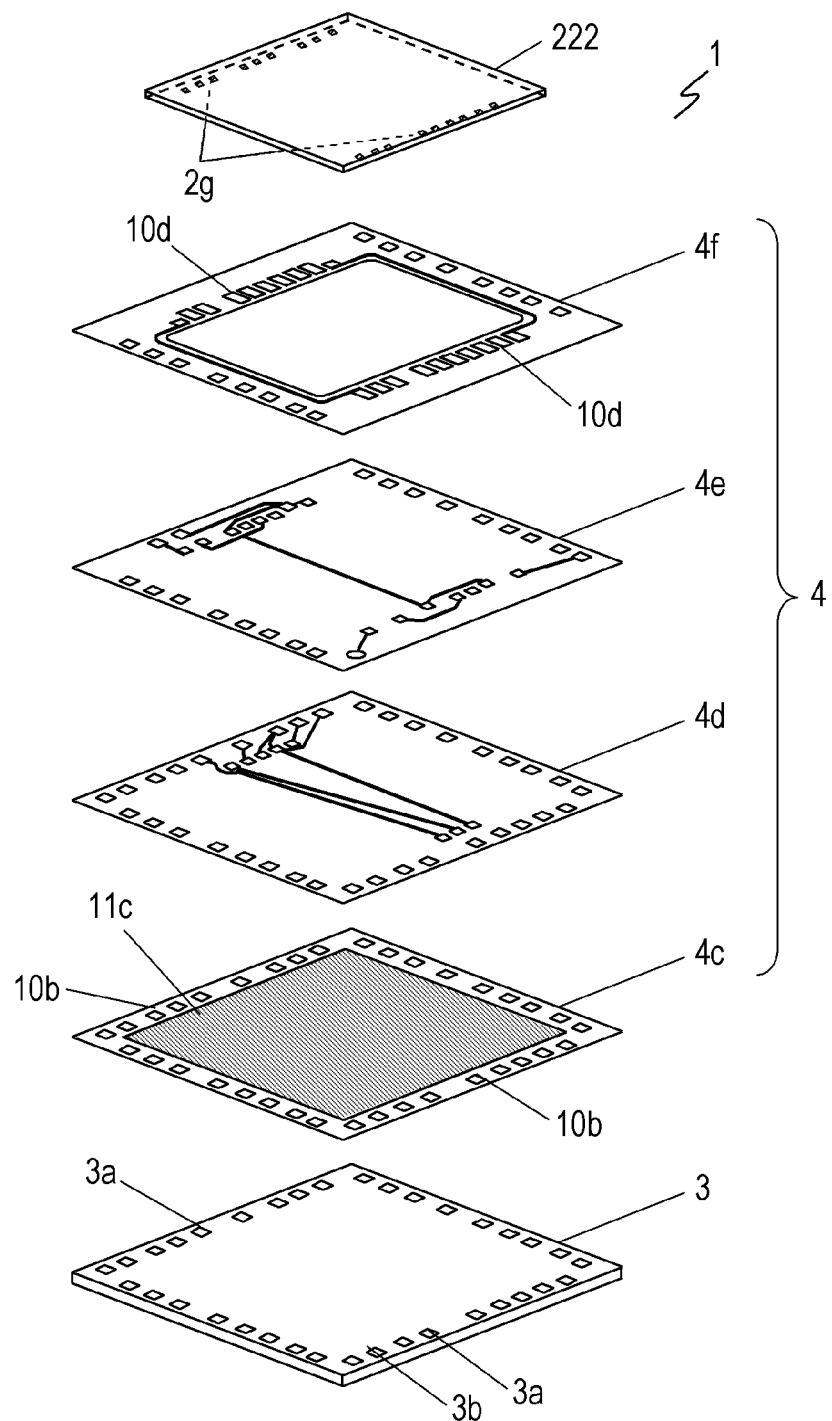
FIG. 5 is an exploded perspective view of the sensor according to Embodiment 1.

FIG. 5 is an exploded perspective view of sensor 1 for showing another wiring connection layer 4. Wiring connection layer 4 shown in FIG. 5 includes four wiring connection layers 4c, 4d, 4e and 4f. Ground layer 11c is formed in an entire wiring region of wiring connection layer 4c which is nearest to circuit board 3 among wiring connection layers 4c, 4d, 4e and 4f located immediately above circuit board 3. This configuration can effectively shield electromagnetic radiation from circuit board 3, thereby preventing high-frequency digital noise from adversely influencing the analog detection signals in the individual wiring layers of wiring connection layers 4c to 4f and sensor element 222.

The number of wiring connection layers is four in wiring connection layer 4 shown in FIG. 5, this is not restrictive. It only needs to adopt the most appropriate number of layers from the viewpoint of downsizing, manufacturing cost, degree of wiring flexibility, and so on.

Exemplary Embodiment 2

Figure 6:
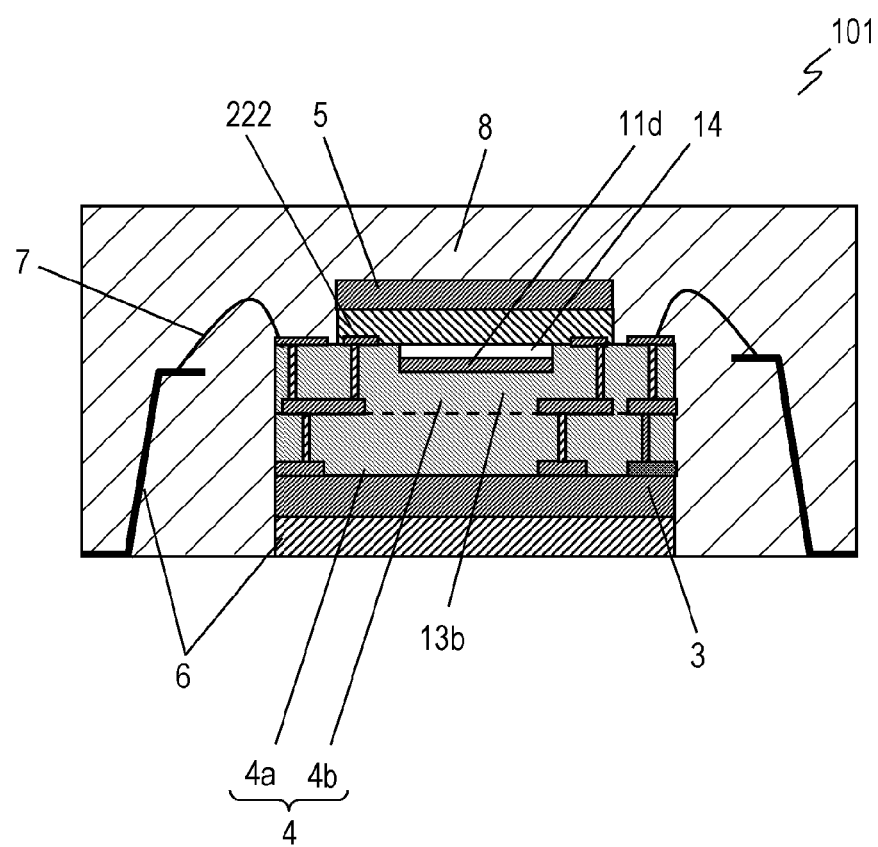
FIG. 6 is a general sectional view of a sensor according to Exemplary Embodiment 2 of the invention.

FIG. 6 is a schematic sectional view of sensor 101 according to Exemplary Embodiment 2 of the present invention. In FIG. 6, components identical to those of sensor 1 according to Embodiment 1 shown in FIG. 4 are denoted by the same reference numerals. Unlike sensor 1 according to Embodiment 1, in sensor 101 according to Embodiment 2, recess 14 is provided in insulation layer 13b of wiring connection layer 4b, and ground layer 11d is formed on a bottom surface of recess 14.

Wiring connection layer 4b is closer to sensor element 222 among wiring connection layer 4a and 4b. Recess 14 is provided in wiring connection layer 4b at a center where the electrodes are not provided at a surface of wiring connection layer 4b facing sensor element 222. As a result, digital noise radiated from circuit board 3 can be shielded effectively by ground layer 11d formed in the region directly below sensor element 222 on wiring connection layer 4b closer to sensor element 222. Ground layer 11d drastically reduces the digital noise causing an adverse effect to a driving electrode or a detection electrode particularly when sensor element 222 has movable portion 2j (FIG. 3A) at a center portion of electrode-bearing surface 2f, and one of the driving electrode and the detection electrode is provided at movable portion 2j.

Figure 7:
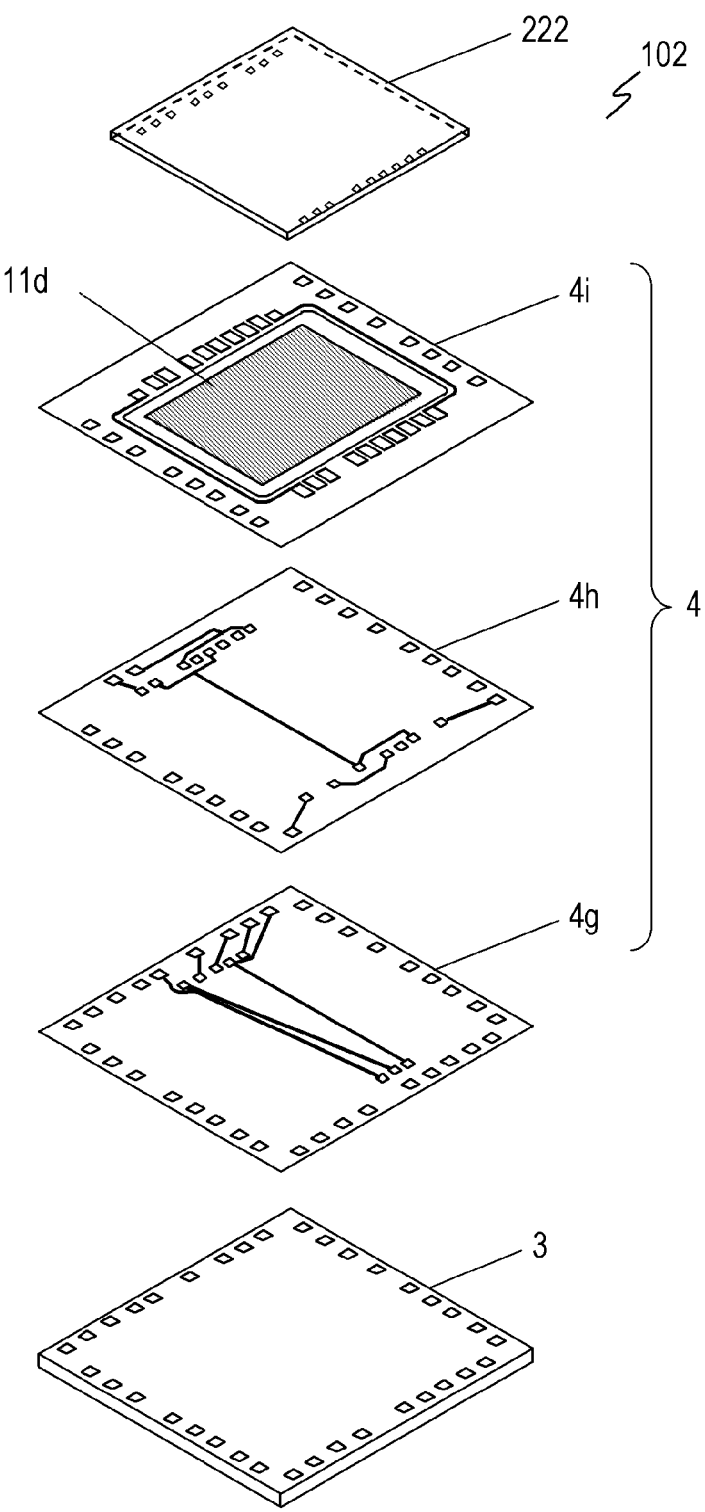
FIG. 7 is an exploded perspective view of the sensor according to Embodiment 2.

FIG. 7 is an exploded perspective view of another sensor 102 according to Embodiment 2 for illustrating wiring connection layer 4. In FIG. 7, components identical to those of sensor 101 shown in FIG. 6 are denoted by the same reference numerals. Wiring connection layer 4 shown in FIG. 7 includes three wiring connection layers 4g, 4h and 4i that are stacked. As shown in FIG. 7, wiring connection layer 4i is closest to sensor element 222 among wiring connection layers 4g, 4h and 4i. The number of wiring connection layers can be decreased by forming ground layer 11d in a recess of the insulation layer of wiring connection layer 4i directly below sensor element 222, hence providing the sensor with a smaller size than sensor 1 shown in FIG. 5 in which one of the wiring connection layers is used as a ground layer. Or, the degree of wiring flexibility can be increased further if the same number of wiring connection layers is used.

Exemplary Embodiment 2

Figure 8:
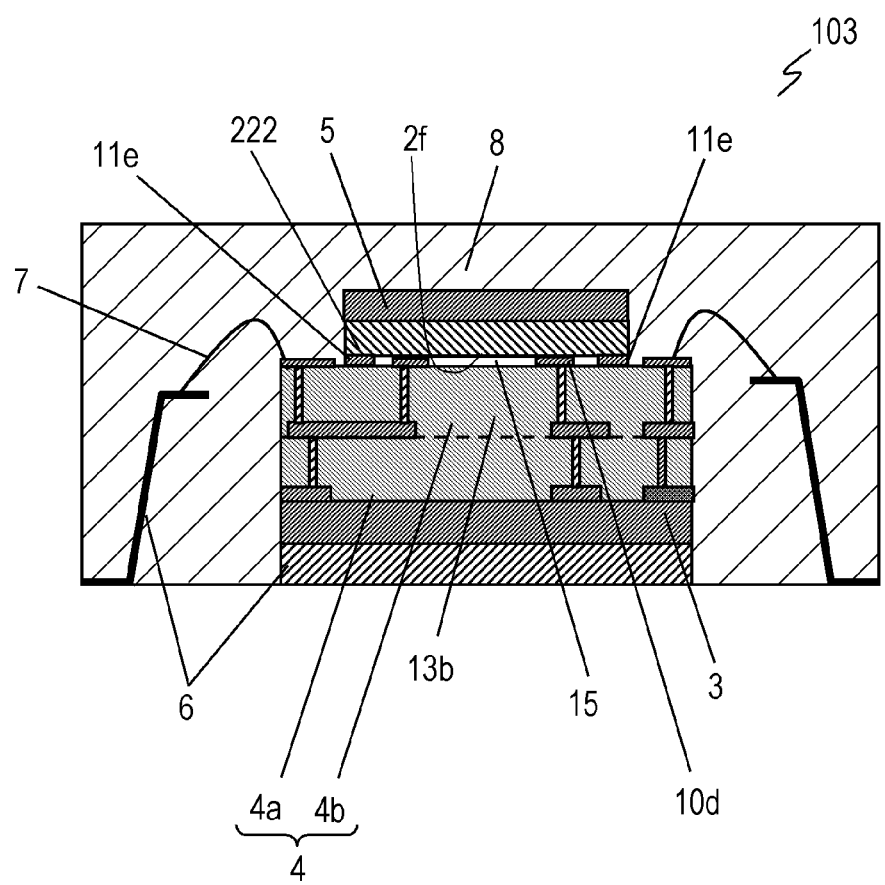
FIG. 8 is a general sectional view of a sensor according to Exemplary Embodiment 3 of the invention.

FIG. 8 is a schematic sectional view of sensor 103 according to Exemplary Embodiment 3 of the present invention. In FIG. 8, components identical to those of sensor 1 according to Embodiment 1 shown in FIG. 4 are denoted by the same reference numerals. Sensor 103 according to Embodiment 3 further includes ground layer 11e formed on insulation layer 13b of wiring connection layer 4b. Ground layer 11e covers an outer perimeter of sensor element 222.

As shown in FIG. 8, a gap is provided between insulation layer 13b and electrode-bearing surface 2f (i.e., bottom surface) of sensor element 222. In addition, sensor element 222 has an outer periphery molded with resin 8 covering the outer periphery. If ground layer 11e is not provided, resin 8 may enter into this gap and spread on electrode-bearing surface 2f of sensor element 222. If resin 8 spreads on electrode-bearing surface 2f of sensor element 222, resin 8 impedes the movement of movable portion 2j and prevents the normal operation as a sensor. Ground layer 11e covers the outer periphery of sensor element 222 to form protected area 15 which prevents resin 8 from entering.

Protected area 15 may be sealed hermetically with top cover 5 and ground layer 11e. The sealing of protected area 15 makes viscous resistance acting on movable portion 2j of sensor element 222 uniform, hence reducing a variation in the sensibility of sensor element 222.

In addition, protected area 15 may be in vacuum. The vacuum inside protected area 15 reduces the gap between sensor element 222 and insulation layer 13b since the vacuum decreases the viscous resistance that acts on movable portion 2j of sensor element 222. Furthermore, ground layer 11e covering the outer periphery of sensor element 222 can shield noises entering from the outside. In sensor 103 according to Embodiment 3, ground layer 11e is provided on insulation layer 13b of wiring connection layer 4b, but may be formed on sensor element 222. Moreover, ground layer 11e may simply be a metal layer connected to any part other than the ground.

Figure 9:
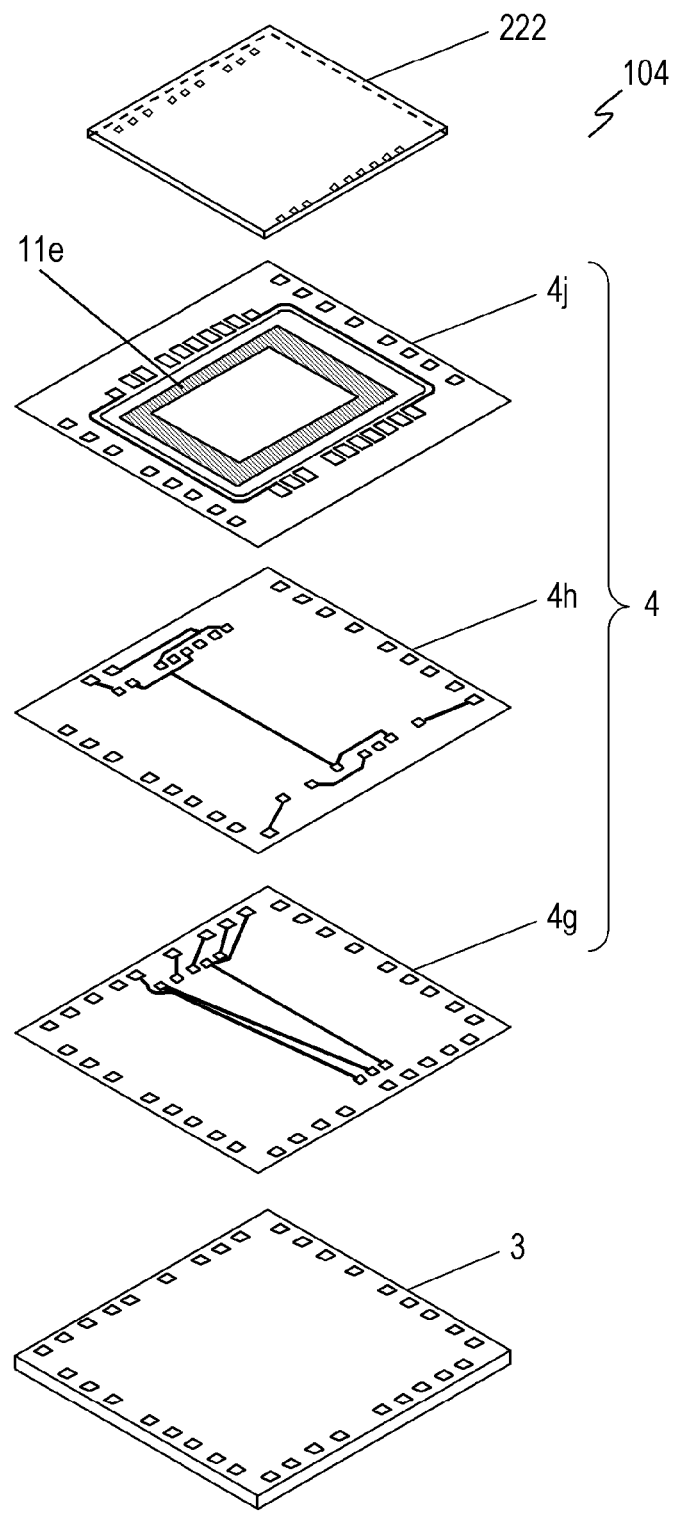
FIG. 9 is an exploded perspective view of the sensor according to Embodiment 3.

FIG. 9 is an exploded perspective view of another sensor 104 according to Embodiment 3. In FIG. 9, components identical to those of sensor 102 of the second embodiment shown in FIG. 7 are denoted by the same reference numerals. Sensor 104 shown in FIG. 9 includes wiring connection layer 4j instead of wiring connection layer 4i shown in FIG. 7. As shown in FIG. 9, ground layer 11e is formed on wiring connection layer 4j directly below electrode-bearing surface 2f (i.e., bottom surface) of sensor element 222. Ground layer 11e covers an outer periphery of sensor element 222. Ground layer 11e and top cover 5 can keep electrode-bearing surface 2f inside a sealed space, and prevent the resin from spreading on electrode-bearing surface 2f.

Exemplary Embodiment 4

Figure 10:
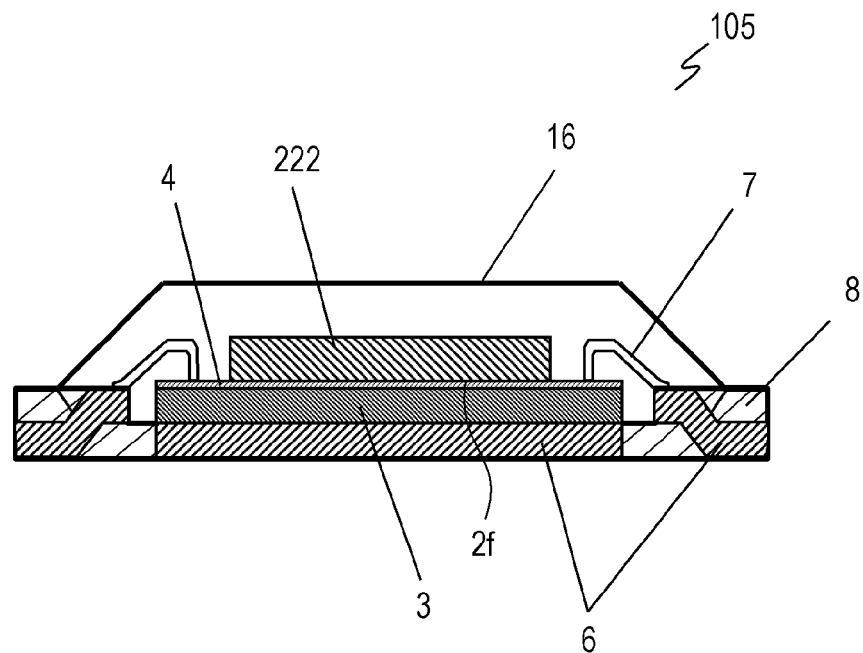
FIG. 10 is a general sectional view of a sensor according to Exemplary Embodiment 4 of the invention.

FIG. 10 is a cross-sectional view of sensor 105 according to Exemplary Embodiment 4. In FIG. 10, components identical to those of sensor 1 according to Embodiment 1 shown in FIG. 2 are denoted by the same reference numerals. Sensor 105 according to Embodiment 4 further includes metal cap 16 in addition to sensor 1 according to Embodiment 1. In sensor 1 according to Embodiment 1, top cover 5, sensor element 222, and circuit board 3 of sensor 1 are molded with resin 8. In sensor 105 according to Embodiment 4, sensor element 222 and circuit board 3 are covered with cap 16. Cap 16 is connected with lead frame 6 that functions as an interconnection board. Lead frame 6 is molded with resin 8. Sensor element 222 and circuit board 3 of sensor 105 are not molded with resin 8. This structure can further reduce the thickness of sensor 105 since top cover 5 of sensor 1 according to Embodiment 1 is not necessary. This structure prevents resin 8 from spreading on electrode-bearing surface 2f of sensor element 222 since resin 8 does not exist around sensor element 222.

Exemplary Embodiment 5

Figure 11:
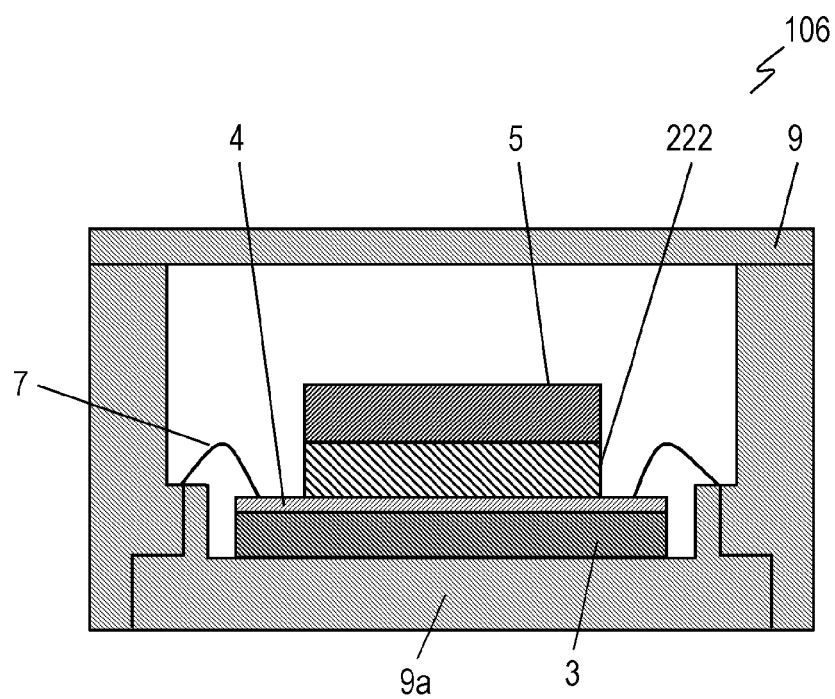
FIG. 11 is a schematic sectional view of a sensor according to Exemplary Embodiment 5 of the invention.

FIG. 11 is a general sectional view of sensor 106 according to Exemplary Embodiment 5 of the present invention. In FIG. 11, components identical to those of sensor 1 according to Embodiment 1 shown in FIG. 2 are denoted by the same reference numerals. Sensor 106 according to Embodiment 5 is accommodated inside ceramic package 9 instead of resin 8 shown in FIG. 2.

As shown in FIG. 11, circuit board 3 is mounted to an upper surface of base section 9a (i.e., interconnection board) of ceramic package 9 with adhesive. Electrodes of wiring connection layer 4 and electrodes of the interconnection board of ceramic package 9 are connected with bonding wires 7, and signals are exchanged with an external circuit connected through base section 9a (interconnection board) of ceramic package 9. Ceramic package 9 often has a high thermal conductivity so that it can efficiently dissipate heat generated by circuit board 3. In addition, ceramic package 9 has a large mechanical strength, accordingly protecting sensor 106 from vibrations and imp acts.

As described above, each of sensors 1 and 101 to 106 according to Embodiments 1 to 5 includes sensor element 222 and circuit board 3 stacked on each other. Wiring connection layer 4 is provided between sensor element 222 and circuit board 3, so that wiring connection layer 4 electrically connects sensor element 222 with circuit board 3. This structure prevents the sensor of high detection accuracy from being affected by noises more than conventional sensors that employ bonding wires for connection between sensor element 222 and circuit board 3.

According to Embodiments 1 to 5, the insulation layer is made of polyimide resin, but may be made of ceramic. Since ceramic has a small difference in linear expansion coefficient from silicon, the ceramic used as the wiring connection layer can decrease a distortion caused by thermal stress. In addition, a glass epoxy substrate is also suitable for the insulation layer. The glass epoxy substrate can provide the sensor with a low cost since glass epoxy is less expensive.

Furthermore, the interconnection board is constituted by base section 9a of lead frame 6 or ceramic package 9 according to Embodiments 1 to 5, but may be made of an epoxy resin substrate. This reduces cost of the sensor since it can reduce the cost of the interconnection board.

Exemplary Embodiment 6

Figure 12:
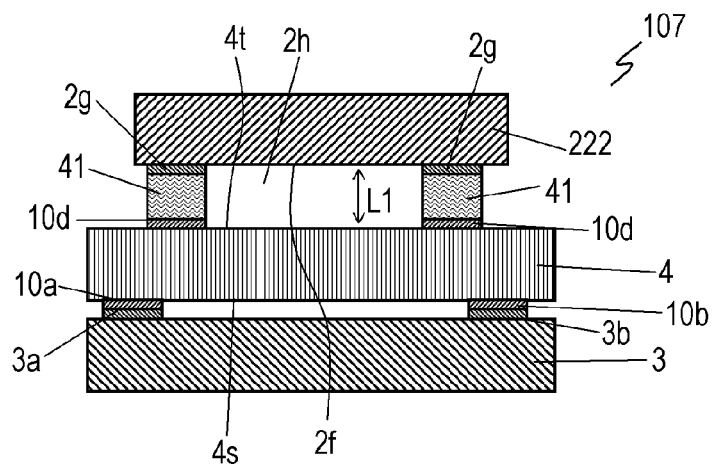
FIG. 12 is a schematic sectional view of a sensor according to Exemplary Embodiment 6 of the invention.

FIG. 12 is a general sectional view of sensor 107 according to Exemplary Embodiment 6 of the present invention. In FIG. 12, components identical to those of sensor 1 according to Embodiment 1 shown in FIGS. 1 to 5 are denoted by the same reference numerals. Wiring connection layer 4 has main surface 4t and back surface 4s opposite to main surface 4t. Electrodes 10d are provided at main surface 4t. Electrodes 10a and 10b are provided at back surface 4s. Electrodes 2g of sensor element 222 are connected to electrodes 10d of wiring connection layer 4. Electrodes 3a and 3b of circuit board 3 are connected to electrodes 10a and 10b of wiring connection layer 4, respectively. Sensor 107 further includes conductive posts 41 provided between electrodes 2g of sensor element 222 and electrodes 10d of wiring connection layer 4 and contact electrodes 2g and electrodes 10d, thus electrically connecting electrodes 2g and 10d of sensor 1 according to Embodiment 1. According to Embodiment 6, conductive post 41 is made mainly of copper, and has gold plating applied to portions of conductive post parts contacting electrodes 2g and 10d.

An external circuit outputs a driving signal to sensor element 222 to vibrate movable portion 2j (FIG. 3A). Upon an inertial force, such as an angular velocity or acceleration, being applied to sensor element 222 while movable portion 2j vibrates, sensor element 222 outputs a signal corresponding to the inertial force from electrodes 2g. Electrode-bearing surface 2f of sensor element 222 faces wiring connection layer 4. Conductive posts 41 provide space 2h between electrode-bearing surface 2f and wiring connection layer 4. Conductive posts 41 does not prevent the vibration of movable portion 2j since electrode-bearing surface 2f faces space 2h secured by conductive posts 41, and decreases viscous resistance of the air acting on movable portion 2j of sensor element 222. As a result, driving impedance of sensor element 222 can be lowered when the external circuit drives to vibrate sensor element 222, thereby allowing the external circuit to drive sensor element 222 efficiently.

Figure 13:
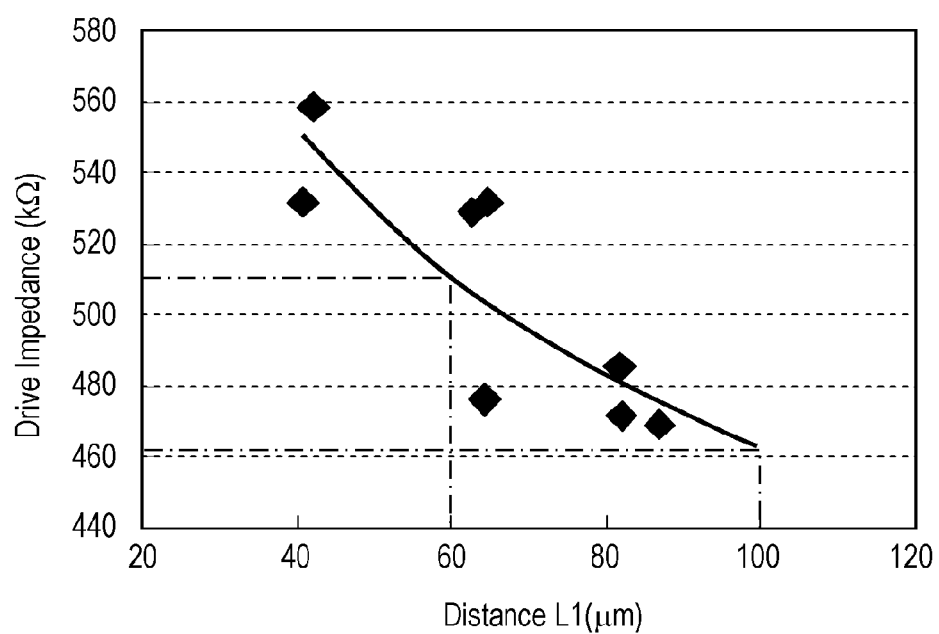
FIG. 13 shows driving impedance of a sensor element of the sensor according to Embodiment 6.

FIG. 13 shows driving impedance of sensor element 222, and more specifically, shows a relationship between distance L1 from electrode-bearing surface 2f of sensor element 222 to wiring connection layer 4, which is a height of space 2h, and driving impedance of sensor element 222. As shown in FIG. 13, distance L1 is preferably equal to or larger than 100 μm. This causes the driving impedance of sensor element 222 to be about 460 kΩ or lower, and allows sensor element 222 to be driven efficiently. Distance L1 of 60 μm further reduces the driving impedance of sensor 107 more than distance L1 of 100 μm. The electrodes often have a thickness equal to or larger than about 20 μm. The height of conductive posts 41 is preferably equal to or larger than 60 μm in order to make distance L1 of 100 μm or larger.

In sensor 107, wiring connection layer 4 may be replaced with any of wiring connection layers 4 of sensors 101 to 104 according to Embodiments 2 and 3 shown in FIGS. 6 to 9. Moreover, sensor 107 may further include cap 16 of sensor 105 or ceramic package 9 of sensor 106 according to Embodiments 4 and shown in FIGS. 10 and 11, respectively.

Exemplary Embodiment 7

Figure 14:
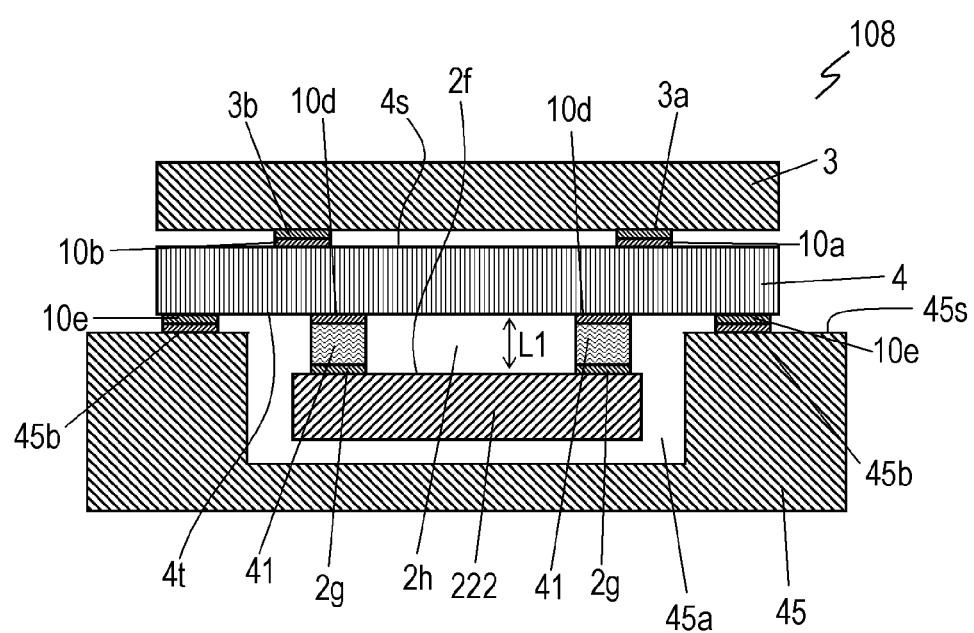
FIG. 14 is a schematic sectional view of a sensor according to Exemplary Embodiment 7 of the invention.

FIG. 14 is a schematic sectional view of sensor 108 according to Exemplary Embodiment 7 of the present invention. In FIG. 14, components identical to those of sensor 107 according to Embodiment 6 shown in FIG. 12 are denoted by the same reference numerals.

Sensor 108 further includes support base 45 having surface 45s having recess 45a provided therein, in addition to the structural components of sensor 107 shown in FIG. 12. Wiring connection layer 4 further has electrodes 10e provided at main surface 4t. Electrode 10e is closer to side edges of wiring connection layer 4 than any of electrodes 10d is. Support base 45 has electrodes 45b provided at surface 45s of support base 45. Electrodes 10e and 45b are connected such that sensor element 222 is accommodated in recess 45a of support base 45. Sensor element 222 is spaced from support base 45. This structure decreases the driving impedance of sensor element 222 as increasing distance L1 between electrode-bearing surface 2f and wiring connection layer 4 of sensor element 222 increases, and reduces the height of sensor 108.

According to Embodiments 1 to 7, the sensors are angular velocity sensors, but may be other sensor elements, such as position sensors, acceleration sensors, or air pressure sensors.

Sensor element 222 and circuit board 3 are stacked together according to Embodiments 1 to 7. Circuit board 3 may be a chip component of integrated circuit, such as an IC chip.

Exemplary Embodiment 8

Figure 15:
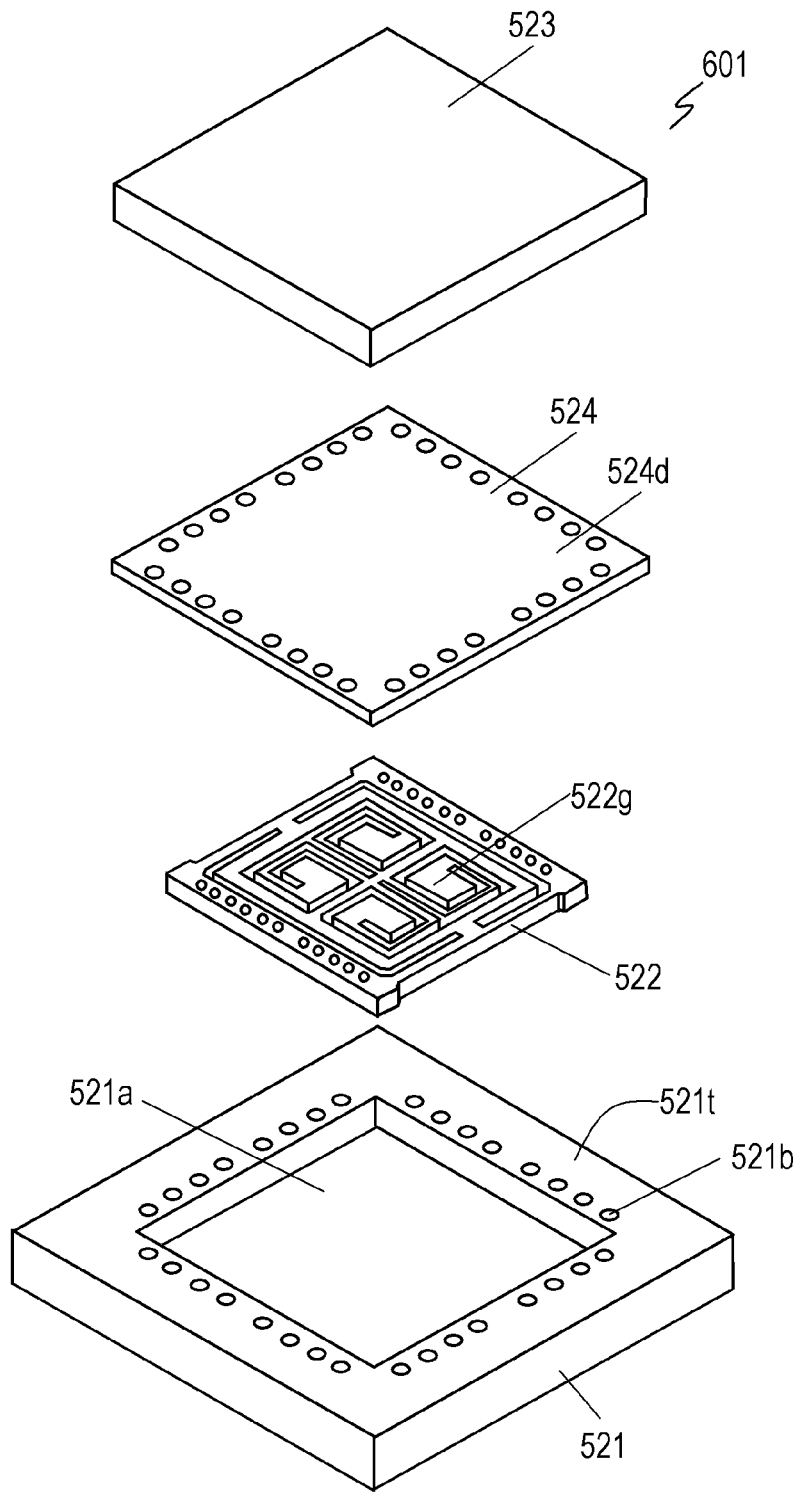
FIG. 15 is an exploded perspective view of a sensor according to Exemplary Embodiment 8 of the invention.
Figure 16:
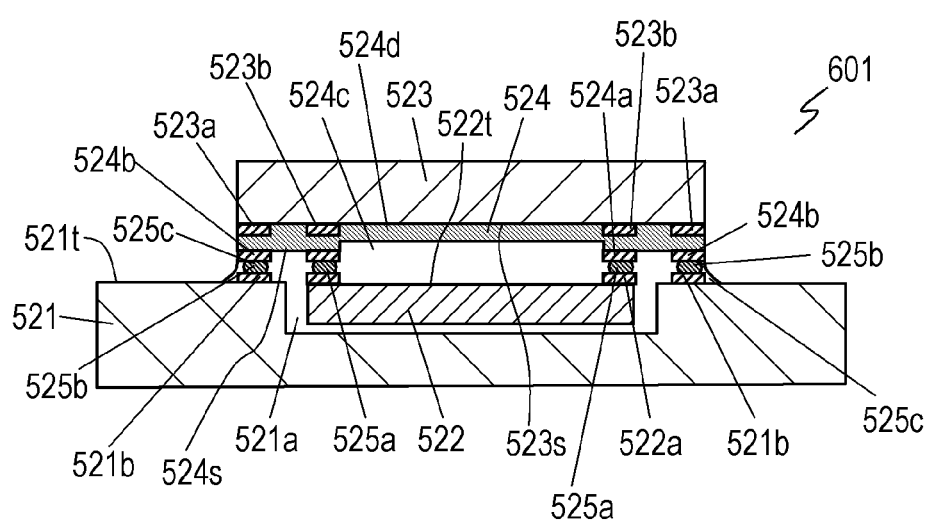
FIG. 16 is a cross-sectional view of the sensor according to Embodiment 8.

FIGS. 15 and 16 are an exploded perspective view and a cross sectional view of sensor 601 according to Exemplary Embodiment 8 of the present invention, respectively. Support base 521 is made of a multilayered printed board or a multilayered ceramic substrate. Support base 521 has upper surface 521t having recess 521a provided therein substantially at a center of upper surface 521t. Support base 521 has outer electrodes provided at its bottom or other surfaces. Electrodes 521b are disposed at upper surface 521t outside recess 521a, and are connected electrically with the outer electrodes. Sensor element 522 is made of, e.g. a single-crystal silicon substrate has movable portion 522g, and converts an angular velocity about a predetermined axis into an electric signal. Circuit board 523 processes the signal output from sensor element 522, and outputs a direct-current (DC) voltage signal or a digital signal corresponding to the angular velocity about the predetermined axis applied to sensor element 522. According to Embodiment 8, circuit board 523 is an IC chip. Circuit board 523 has electrodes 523a and 523b provided at a periphery of lower surface 523s. Wiring connection layer 524 includes insulation layer 524d made of an elastic material, such as polyimide. Wiring connection layer 524 further includes electrodes 524a and 524b provided at lower surface 524s. Sensor element 522 has electrodes 522a provided at a periphery of upper surface 522t. Electrodes 524a confront electrodes 522a. Electrodes 523a are connected electrically with electrodes 524a. Support base 521 has electrodes 521b provided at upper surface 521t outside recess 521a. Electrodes 524b face electrodes 521b. Electrodes 523b of circuit board 523 are connected electrically with electrodes 524b. Electrodes 522a and electrodes 524a are connected with conductive posts 525a made of a conductive material, such as solder and gold. Wiring connection layer 524 has lower surface 524c having recess 524c formed therein substantially at a center of lower surface 524s. Recess 524c prevents air damping attributed to viscous resistance of the air from affecting to the movable portion. Electrodes 524b are connected to electrodes 521b via conductive posts 525b such that sensor element 522 is accommodated in recess 521a of support base 521 and does not contact support base 521. Underfill resin 525c is injected into an area around conductive posts 525b to fill a space between wiring connection layer 524 and support base 521 so as to seal recess 521a of support base 521.

Figure 17:
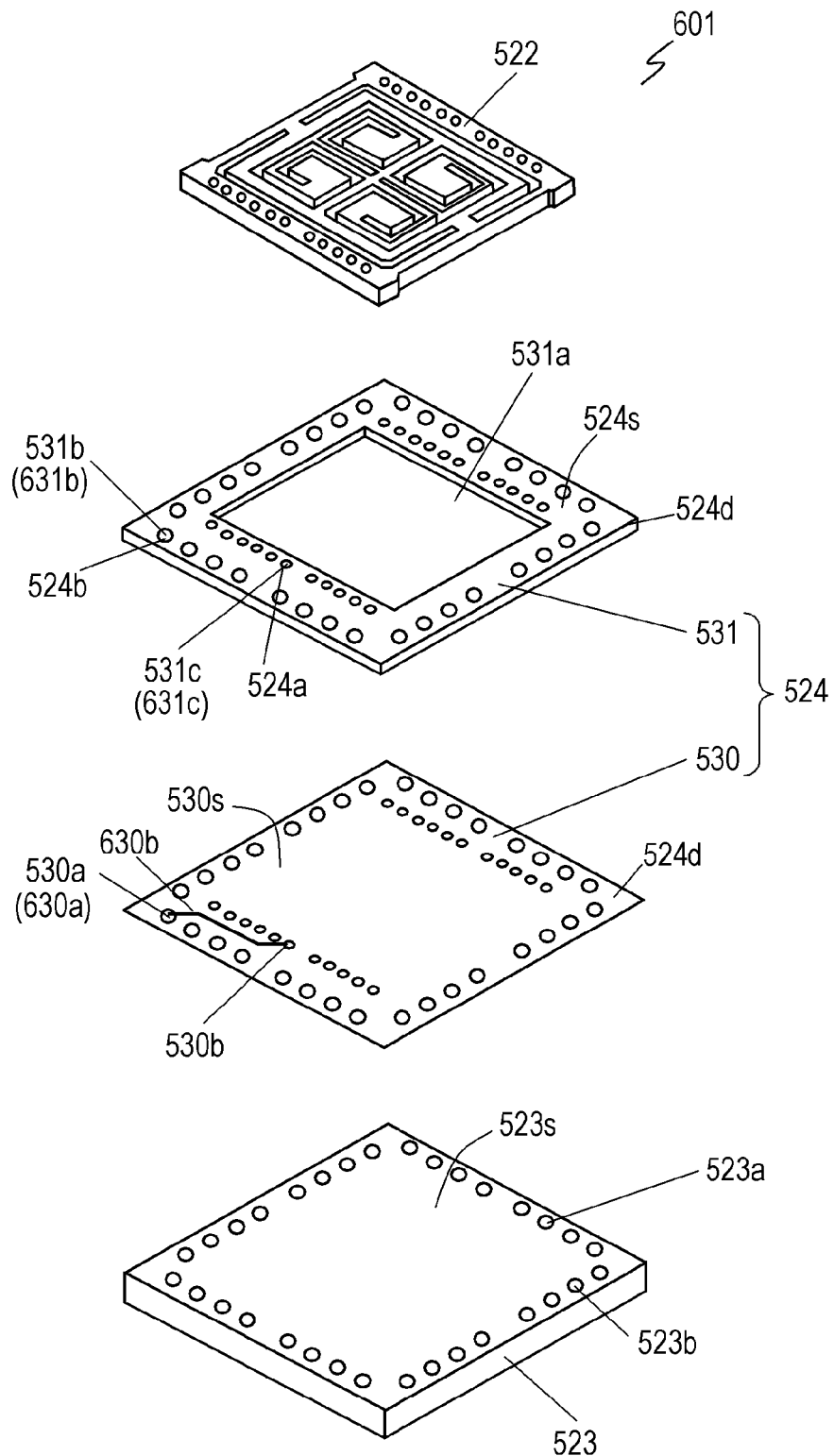
FIG. 17 is an exploded perspective view of the sensor according to Embodiment 8 for illustrating a wiring connection layer.

FIG. 17 is an exploded perspective view of sensor 601 which specifically focuses on wiring connection layer 524. A method of forming wiring connection layer 524 on circuit board 523 will be described below with referring to FIG. 17. First, resin layer 530 having a thickness of about 2 μm is formed on circuit board 523 by spin-coating a photosensitive coating material, such as polyimide, and then pre-baking the material. Next, resin layer 530 is irradiated with ultraviolet rays through a photo mask having a predetermined pattern. Then, resin layer 530 is developed, rinsed, and cured. These processes photo-cures to remain portions of resin layer 530 irradiated with ultraviolet rays, whereas uncured portions of resin layer 530 protected from the ultraviolet rays by photo mask are dissolved and removed. Through-holes 630a are then formed to penetrate to reach electrodes 523a on circuit board 523. Next, a metal layer made of, e.g. nickel is formed on surface 530s of resin layer 530 by a sputtering method. At this moment, the metal layer is formed on inner walls of through-holes 630a to make via-conductors 530a. Subsequently, electrodes 530b and wiring traces 630b are formed on surface 530s of resin layer 530 by a photolithographic technique and etching technique. Wiring traces 630b connect electrodes 530b and via-conductors 530a.

Next, resin layer 531 having a thickness of about 70 μm is formed on surface 530s of resin layer 530 by spin-coating a photosensitive coating material, such as polyimide, and pre-baking the material. Resin layer 531 is then irradiated with ultraviolet rays through a photo mask having a predetermined pattern. Then, resin layer 531 is developed, rinsed, and cured. These processes form through-holes 631b and 631c that reaches via-conductors 530a and electrodes 530b formed on resin layer 530. The processes also form opening 531a that constitutes recess 524c substantially at the center thereof. Next, a metal layer made of, e.g. nickel is formed on the surface of resin layer 531 by a sputtering method. At this moment, the metal layer is formed on inner walls of through-holes 631b and 631c to make via-conductors 531b and 531c. Subsequently, a portion of the metal layer other than via-conductors 531b and 531c and their surrounding areas is removed by a photolithographic technique and etching technique. Finally, electrodes 524a and 524b are formed on resin layer 531 by an electrolysis-plating process.

In sensor 601 according to Embodiment 8, sensor element 522 is mechanically and electrically connected to circuit board 523 with conductive posts 525a. Sensor element 522 is accommodated in recess 521a provided substantially in the center of support base 521. Then, circuit board 523 and support base 521 are connected electrically and mechanically through conductive posts 525b. This configuration makes bonding wires unnecessary which otherwise hamper the efforts of downsizing the sensor. In addition, the above configuration can eliminate a cap for protecting active components of circuit board 523 and sensor element 522 since recess 521a of support base 521 is sealed with under-fill resin 525c, hence providing sensor 601 with a small size.

Sensor element 522 is accommodated in recess 521a which being apart from support base 521. According to Embodiment 8, wiring connection layer 524 includes insulation layer 524d made of an elastic material, such as polyimide, having Young's modulus ranging from 0.6 GPa to 6 GPa. Circuit board 523 and sensor element 522 are connected via wiring connection layer 524 made of the elastic material. This structure allows no strain to remain in sensor element 522 after the process of thermal-compression bonding of conductive posts 525a between circuit board 523 and sensor element 522. Therefore, circuit board 523 can be protected from being damaged by ultrasonic during compression bonding of conductive posts 525b to electrodes 521b and 524b between circuit board 523 and support base 521. A thermal stress can also be alleviated by wiring connection layer 524 even if there is any difference in linear expansion coefficients between circuit board 523 and support base 521 or between circuit board 523 and sensor element 522. In addition, a temperature characteristic of the output of sensor element 522 does not deteriorate or hysteresis does not occur in the output of sensor element 522 even when deformation occurs in a printed circuit board on which support base 521 is mounted, since a stress attributed to the deformation of the printed circuit board is not exerted directly upon sensor element 522. Sensor 601 has small size and height, and can detect angular velocity accurately.

Exemplary Embodiment 9

Figure 18:
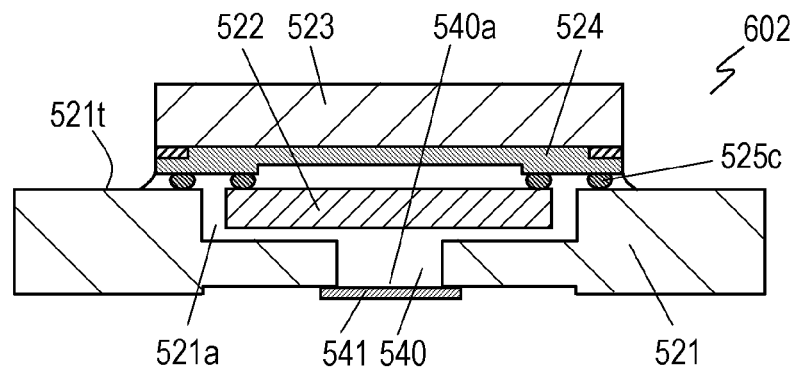
FIG. 18 is a cross-sectional view of a sensor according to Exemplary Embodiment 9 of the invention.

FIG. 18 is a cross sectional view of sensor 602 according to Exemplary Embodiment 9 of the present invention. In FIG. 18, components identical to those of sensor 601 according to Embodiment 8 shown in FIGS. 15 to 17 are denoted by the same reference numerals.

In sensor 602 according to Embodiment 9, through-hole 540 is provided in support base 521 for communicating recess 521a and an outside of support base 521. Barrier membrane 541 which allows only gas to pass through barrier membrane 541 is provided at opening 540a of support base 521 where through-hole 540 opens. Barrier membrane 541 closes through-hole 540. Barrier membrane 541 is made of a microporous material, such as poly-tetrafluoroethylene perfluoroalkylvinyl-ether (PFA) or poly-tetrafluoroethylene hexafluoride propylene (FEP), disabling any liquid and solid substances to pass through and enabling gas, such as air, to pass through.

Barrier membrane 541 prevents foreign substances in a liquid-form and a solid-form from entering into recess 521a provided in upper surface 521t of support base 521. Barrier membrane 541 thus has gas permeability, and can avoid a difference in the air pressure developed between recess 521a and the outside. This structure prevents flux substances from entering into recess 521a when sensor 602 is mounted to a printed circuit board by a reflow mounting method, and prevents a variation in the characteristic of sensor 602 by avoiding an increase in internal pressure of recess 521a, thereby providing sensor 602 which can accurately and steadily detect physical quantities, such as acceleration or angular velocity.

In sensor 108 according to Embodiment 7, support base 45 may have a through-hole similar to through-hole 540, and a membrane similar to barrier membrane 541 to close the through-hole Exemplary Embodiment 10

Figure 19:
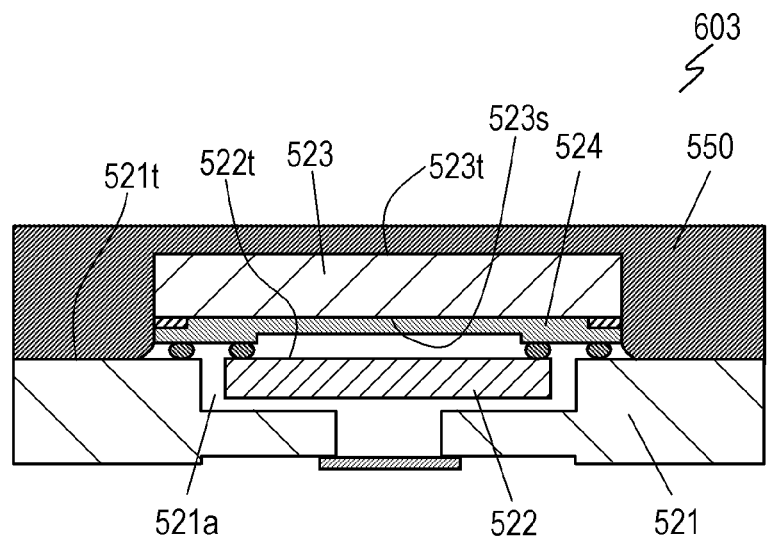
FIG. 19 is a cross-sectional view of a sensor according to Exemplary Embodiment 10 of the invention.

FIG. 19 is a cross sectional view of sensor 603 according to Exemplary Embodiment 10 of the present invention. In FIG. 19, components identical to those of sensor 602 according to Embodiment 9 shown in FIG. 18 are denoted by the same reference numerals.

Sensor 603 according to Embodiment 10 further includes resin 550 that covers upper surface 523t and a side surface of circuit board 523 and upper surface 521t of support base 521 in addition to sensor 603 according to Embodiment 9 shown in FIG. 18. Resin 550 can be formed by injecting a resin material into a metal mold after placing and clamping support base 521 bonded with circuit board 523 into the metal mold.

In sensor 603, sensor element 522 is sealed in recess 521a, and bonding wire is not used. This configuration can increase a physical strength of circuit board 523 without applying any stress directly to sensor element 522 and the bonding wire when the resin is molded, and can protect circuit board 523, such as an IC chip, from static electricity. Accordingly, sensor 603 can detect physical quantities, such as acceleration or angular velocity accurately and steadily since sensor 603 can be mounted easily to the printed circuit board.

Figure 20A:
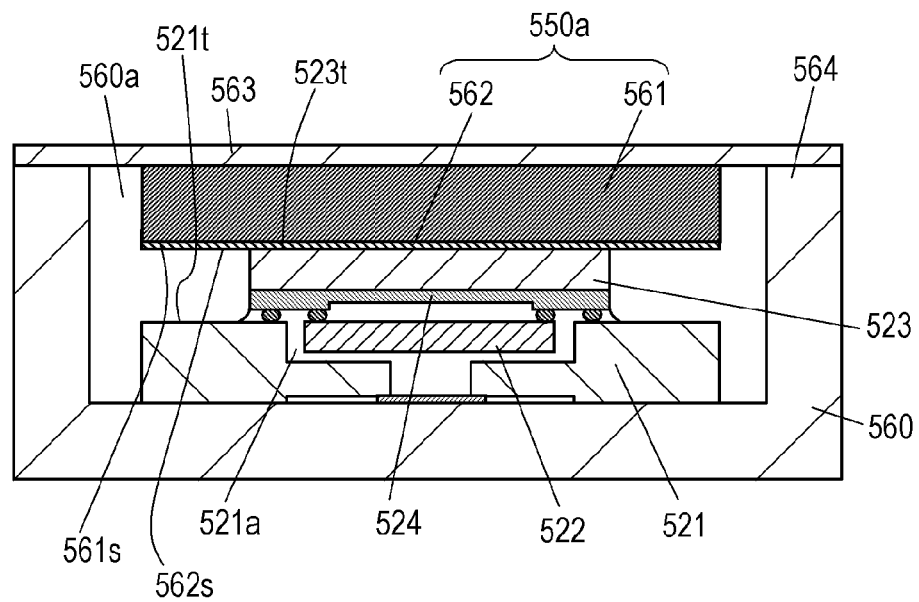
FIG. 20A is a cross-sectional view of the sensor according to Embodiment 10 for illustrating a method of manufacturing the sensor.
Figure 20B:
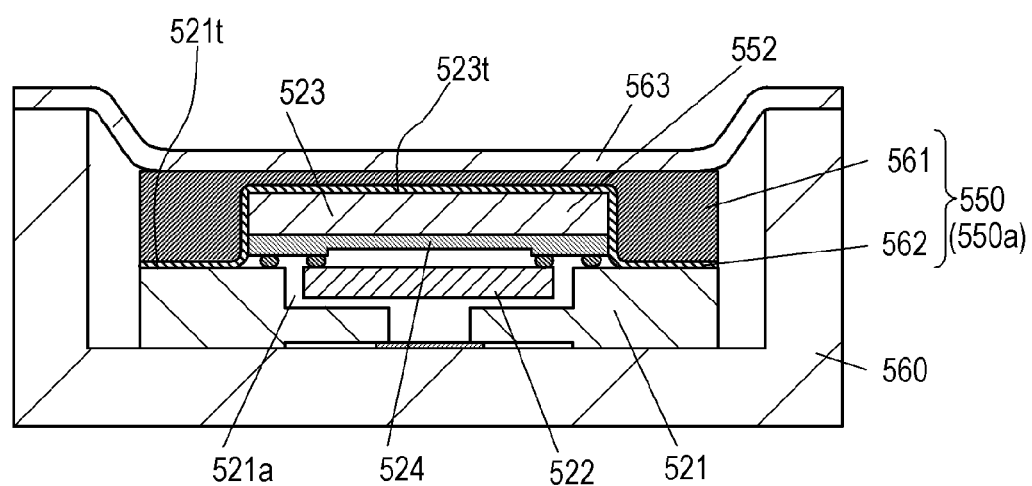
FIG. 20B is a sectional view of the sensor according to Embodiment 10 for illustrating the method of manufacturing the sensor.
Figure 20C:
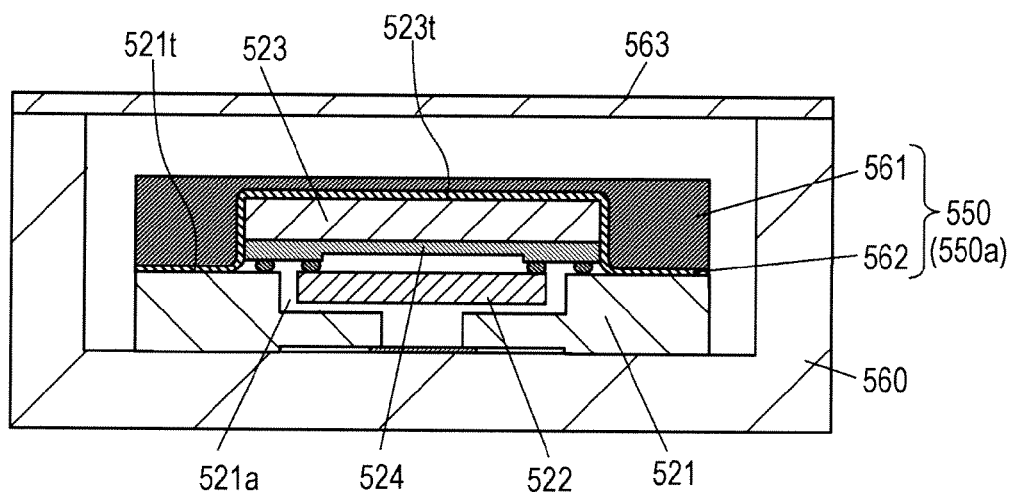
FIG. 20C is a sectional view of the sensor according to Embodiment 10 for illustrating the method of manufacturing the sensor.

FIGS. 20A to 20C are cross-sectional views of sensor 603 for illustrating a method of manufacturing sensor 603, which is another method of covering upper surface 523*t* and the side surface of circuit board 523 and upper surface 521*t* of support base 521 with resin 550.

FIG. 20A illustrates processing tool 564 for forming resin 550. Processing tool 564 includes processing tray 560 having recess 560*a* provided therein and diaphragm 563 for sealing recess 560*a*. Support base 521 bonded with circuit board 523 is placed in recess 560*a* of processing tray 560 while resin material 550*a* is placed on upper surface 523*t* of circuit board 523, as shown in FIG. 20A. Resin material 550*a* includes resin 561 and laminated film 562 adhering to a lower surface of resin 561. Resin 561 is at a semi-cured B-stage not having stickiness under normal temperatures. A lower surface of laminated film 562 is placed on upper surface 523*t* of circuit board 523. Diaphragm 563 has plasticity and heat resistance.

Next, the air inside of processing tray 560 is discharged, and diaphragm 563 is heated and compressed, as shown in FIG. 20B, to soften resin 561 and cause resin material 550*a* to cover upper surface 523*t* and the side surface of circuit board 523 as well as upper surface 521*t* of support base 521.

Next, an inside of recess 560*a* of processing tray 560 opens to the atmosphere and the compression to diaphragm 563 is released, as shown in FIG. 20C, and resin 561 is cooled. As a result, resin 561 is completely cured. The above processes can cause resin material 550*a*, i.e. resin 550, to cover and protect upper surface 523*t* and the side surface of circuit board 523 as well as upper surface 521*t* of support base 521, thereby providing sensor 603 detecting physical quantities, such as acceleration or angular velocity, accurately and steadily As discussed above, each of sensors 601 to 603 according to Embodiment 8 to 10 includes support base 521, sensor element 522, and circuit board 523. Support base 521 has recess 521*a* formed therein substantially at a center thereof. Sensor element 522 has a movable portion, and converts a physical quantity, such as acceleration and angular velocity, into an electric signal. Circuit board 523 processes a signal output from sensor element 522. A peripheral area of upper surface 522*t* of sensor element 522 and lower surface 523*s* of circuit board 523 are connected electrically and mechanically through wiring connection layer 524 containing an elastic material. Upper surface 521*t* of support base 521 and the lower surface of circuit board 523 are connected electrically and mechanically such that sensor element 522 is accommodated in recess 521*a* and is apart from support base 521 while recess 521*a* is sealed. That is, sensor element 522 is sealed in recess 521*a* provided in support base 521 by electrically and mechanically connecting between sensor element 522 and circuit board 523 as well as between circuit board 523 and support base 521 with wiring connection layer 524 containing of the elastic material. In addition, sensor element 522 is prevented from directly contacting support base 521. This structure makes wires for connecting between the individual components unnecessary, and prevents sensor element 522 from being influenced by the external stresses, thereby providing sensors 601 to 603 with small size and height, and capable of accurately detecting physical quantities, such as acceleration and angular velocity.

Sensors 601 to 603 are especially useful for transportation equipment, such as automobiles and aircrafts, as well as portable terminals, and used as sensors for detecting the physical quantities, such as acceleration and angular velocity that act on these devices.

According to Embodiments 8 to 10, sensors 601 to 603 are also applicable to other sensor elements 622, such as position sensors, acceleration sensors, and air pressure sensors.

In the above embodiments, terms, such as "upper surface" and "lower surface", indicating directions indicate relative directions that depend only on relative positions of structural components, such as the sensor element and the wiring connection layer, of the sensor, and does not indicate absolute directions, such as a vertical direction.

INDUSTRIAL APPLICABILITY

A sensor according to the present invention are widely applicable as a sensor mounted to portable devices, such as mobile phones, digital cameras, portable game machines, and PDA.

REFERENCE MARKS IN THE DRAWINGS

2*g* Electrode (Fourth Electrode)
2*f* Electrode-Bearing Surface
2*j* Movable Portion
3 Circuit Board
3*a*, 3*b* Electrode (First Electrode)
4 Wiring Connection Layer
4*t* Main Surface
4*s* Back Surface
5 Top Cover
6 Lead Frame (Interconnection Board)
7 Bonding Wire
8 Resin
10*a*, 10*b* Electrode (Second Electrode)
10*d* Electrode (Third Electrode)
10*e* Electrode (Fifth Electrode)
11*a*, 11*b* Wiring Layer
11*c*, 11*d*, 11*e* Ground Layer
13*a*, 13*b* Insulation Layer
14 Recess
15 Protected Area
16 Cap
41 Electrically Conductive Post
45 Support Base
45*a* Recess
45*b* Electrode (Sixth Electrode)
222 Sensor Element
521 Support Base
521*a* Recess
522 Sensor Element
522*g* Movable Portion
523 Circuit Board
524 Wiring Connection Layer
540 Through-Hole
541 Barrier Membrane
550 Resin

The invention claimed is:

1. A sensor comprising:
a circuit board having a first electrode;
a wiring connection layer having a main surface and a back surface opposite to the main surface, the wiring connection layer having a second electrode and a third electrode, the second electrode being provided at the main surface, the third electrode being provided at the back surface;
a sensor element having a fourth electrode; and
a support base having a surface having a recess provided therein, wherein the first electrode is connected electrically with the second electrode, wherein the third electrode is connected electrically with the fourth electrode, wherein the second electrode is connected electrically with the third electrode, wherein the sensor element has an electrode-bearing surface having a movable portion and the fourth electrode which are provided at the electrode-bearing surface, wherein the electrode-bearing surface of the sensor element faces the back surface of the wiring connection layer, wherein the wiring connection layer further has a fifth electrode provided at the back surface, and the fifth electrode is closer to an edge of the wiring connection layer than the third electrode is, wherein the support base has a sixth electrode provided at the surface of the support base, wherein the fifth electrode and the sixth electrode are connected such that the sensor element is accommodated in the recess of the support base, and wherein the recess of the support base is sealed.

2. The sensor according to claim 1, wherein the support base has a through-hole passing therethrough, the through-hole being connected with the recess so as to allow the recess to communicate with an outside of the recess, the sensor further comprising a barrier membrane that closes the through-hole and allows only gas to pass through the barrier membrane.

3. The sensor according to claim 1, further comprising a resin that covers an upper surface and a side surface of the circuit board and an upper surface of the support base.

4. An angular velocity sensor comprising:
a substrate;
a circuit board disposed on the substrate, the circuit board having a first electrode;
a wiring connection layer having a main surface and a back surface opposite to the main surface, the wiring connection layer having a second electrode and a third electrode, the second electrode being provided at the main surface, the third electrode being provided at the back surface; and
a sensor element to detect an angular velocity, the sensor element having a fourth electrode;
wherein the first electrode is connected electrically with the second electrode,
wherein the third electrode is connected electrically with the fourth electrode,
wherein the second electrode is connected electrically with the third electrode,
wherein the surface of the sensor element faces the back surface of the wiring connection layer,
wherein the wiring connection layer further has a fifth electrode provided at the back surface,
wherein a metal wire is connected electrically to the fifth electrode,
wherein the sensor element has a movable portion,
wherein a recess portion is formed on the back surface of the wiring connection layer facing the movable portion, and
wherein the wiring connection layer further includes a metal member which is disposed in a region of the wiring connection layer surrounded by the third electrodes and the fifth electrodes.

5. The angular velocity sensor according to claim 4, wherein the movable portion comprises a driving electrode or a detection electrode.

6. The angular velocity sensor according to claim 4, wherein the sensor element comprises a piezoelectric material and an electrode disposed on the piezoelectric material.

7. The angular velocity sensor according to claim 6, wherein a displacement of the sensor element due to Coriolis force caused by an angular velocity applied to the sensor element is detected as an electric charge generated by the piezoelectric material.

8. The angular velocity sensor according to claim 4, wherein the recess is provided in the wiring connection layer in a portion where no electrodes are provided.

9. The angular velocity sensor according to claim 4, wherein the third electrode and the fifth electrode are disposed substantially at the same height above the substrate, and a bottom surface of the recess portion is disposed at lower height than the height of the third electrode and the fifth electrode.

10. The angular velocity sensor according to claim 4, wherein the movable portion comprises at least four arms.

11. An angular velocity sensor comprising:
a substrate;
a circuit board disposed on the substrate, the circuit board having first electrodes;
a wiring connection layer having a main surface and a back surface opposite to the main surface, the wiring connection layer having second electrodes and third electrodes, the second electrodes being provided at the main surface, the third electrodes being provided at the back surface; and
a sensor element to detect an angular velocity, the sensor element having fourth electrodes;
wherein the first electrodes are connected electrically with the second electrodes respectively,
wherein the third electrodes are connected electrically with the fourth electrodes respectively,
wherein the second electrodes are connected electrically with the third electrode,
wherein the surface of the sensor element faces the back surface of the wiring connection layer,
wherein the wiring connection layer further has fifth electrodes provided at the back surface,
wherein metal wires are connected electrically to the fifth electrodes,
wherein the sensor element has a movable portion,
wherein the wiring connection layer further has a metal member having a frame shape, and
wherein the metal member is disposed in a region of the wiring connection layer surrounded by the third electrodes and the fifth electrodes.

12. The angular velocity sensor according to claim 11, wherein an inner region of the metal member faces the movable portion.

13. The angular velocity sensor according to claim 11, wherein the movable portion comprises a driving electrode or a detection electrode.

14. The angular velocity sensor according to claim 11, wherein the sensor element comprises a piezoelectric material and an electrode disposed on the piezoelectric material.

15. The angular velocity sensor according to claim 11, wherein a displacement of the sensor element due to Coriolis force caused by an angular velocity applied to the sensor element is detected as an electric charge generated by the piezoelectric material.

16. The angular velocity sensor according to claim 11, wherein the movable portion comprises at least four arms.

* * * * *